(12) United States Patent
Akahori

(10) Patent No.: US 6,723,994 B2
(45) Date of Patent: Apr. 20, 2004

(54) SEMICONDUCTOR ENERGY DETECTOR

(75) Inventor: Hiroshi Akahori, Hamamatsu (JP)

(73) Assignee: Hamamatsu Photonics K.K., Shizuoka (JP)

( * ) Notice: Subject to any disclaimer, the term of this patent is extended or adjusted under 35 U.S.C. 154(b) by 41 days.

(21) Appl. No.: 10/176,191

(22) Filed: Jun. 21, 2002

(65) Prior Publication Data

US 2002/0162964 A1 Nov. 7, 2002

Related U.S. Application Data

(63) Continuation-in-part of application No. PCT/JP00/09140, filed on Dec. 22, 2000.

(30) Foreign Application Priority Data

Dec. 24, 1999 (JP) ............................. 11-367631

(51) Int. Cl.[7] ..................... G01T 1/24; H01L 25/00; H01L 27/00; H01L 29/747; H01L 29/74
(52) U.S. Cl. ..................... 250/370.08; 250/370.14; 257/215; 257/223; 257/231; 257/249
(58) Field of Search ................. 257/215, 223, 257/228, 230, 231, 249; 250/370.01, 370.08, 370.09, 370.14

(56) References Cited

U.S. PATENT DOCUMENTS

| 4,788,592 A | * | 11/1988 | Yamawaki et al. ......... 348/296 |
| 5,118,631 A | * | 6/1992 | Dyck et al. ................... 438/79 |
| 5,239,380 A | * | 8/1993 | Yokoyama .................. 348/319 |
| 5,326,997 A | * | 7/1994 | Nakanishi .................... 257/230 |
| 5,349,215 A | * | 9/1994 | Anagnostopoulos et al. ........................... 257/230 |
| 5,432,551 A | * | 7/1995 | Matsunaga ................... 348/299 |
| 5,455,443 A | * | 10/1995 | Maki et al. .................. 257/323 |
| 5,517,244 A | * | 5/1996 | Stekelenburg et al. ....... 348/305 |
| 5,585,298 A | * | 12/1996 | Stevens et al. ............... 438/79 |
| 5,844,264 A | * | 12/1998 | Shinji .......................... 257/223 |
| 5,914,506 A | * | 6/1999 | Nakashiba .................. 257/221 |
| 6,650,369 B2 | * | 11/2003 | Koizumi et al. ............ 348/301 |

FOREIGN PATENT DOCUMENTS

| JP | 54-24530 | 2/1979 |
| JP | 6-29506 | 2/1994 |
| JP | 6-350068 | 12/1994 |

OTHER PUBLICATIONS

Kotai Eizou Soshi no Kiso; Denshi no Me no Shikumi (Japan) Kabushiki Kaisha Nihon Rikou Shuppankai, Dec. 10, 1999, pp. 103–106.

* cited by examiner

*Primary Examiner*—Albert Gagliardi
*Assistant Examiner*—Davienne Monbleau
(74) *Attorney, Agent, or Firm*—Morgan, Lewis & Bockius LLP

(57) ABSTRACT

A semiconductor energy detector having a region for detection and charge accumulation/transfer where a two-dimensional pixel array is formed on a surface of a semiconductor substrate on which energy rays become incident, is characterized in that the region for detection and charge accumulation/transfer comprises a plurality of transfer electrodes formed in each pixel, and an excess charge removing means arranged in correspondence with one of the transfer electrodes in each pixel.

7 Claims, 7 Drawing Sheets

B - B' SECTIONAL VIEW

C-C' SECTIONAL VIEW

A-A' SECTIONAL VIEW

ONE PIXEL

B-B' SECTIONAL VIEW

C-C' SECTIONAL VIEW

A-A' SECTIONAL VIEW

SEMICONDUCTOR ENERGY DETECTOR

RELATED APPLICATION

The present application is a continuation-in-part application of PCT application No. PCT/JP00/09140 filed on Dec. 22, 2000, designating U.S.A. and now pending.

BACKGROUND OF THE INVENTION

1. Technical Field of the Invention

The present invention relates to a semiconductor energy detector effective for irradiation of energy rays such as UV rays, radiant rays, or particle rays which have very large absorption coefficients.

2. Related Background Art

Conventionally, a semiconductor energy detector disclosed in, e.g., Japanese Patent Laid-Open No. 6-29506 is known. Additionally, a semiconductor energy detector manufacturing method disclosed in, e.g., Japanese Patent Laid-Open No. 6-350068 is also known.

A charge-coupled device (CCD) sequentially transfers a charge cloud in one direction at a speed synchronous with a clock pulse. A CCD is a very ingenious functional device capable of converting spatial information into a time-series signal. However, to extract two-dimensional image information as a time-series signal, a certain device implementation is necessary. If charges are transferred while keeping the device irradiated with light, charges that are optically excited at the respective positions and transferred charges mix with each other to cause a phenomenon called smearing, resulting in degradation in video signal. To avoid this, the period (charge accumulation period) when the device is being irradiated with light and the period (charge transfer period) when charges are being transferred are temporally divided to do so-called time-divisional operation. Since the period when a video signal is output is limited within the charge transfer period, the video signal is intermittently output.

Generally, typical schemes of practical image sensing devices are frame transfer (FT), full-frame transfer (FFT), and interline transfer (IT). For measurements, the full-frame transfer (FFT) scheme is mainly used. This is because the full-frame transfer (FFT) scheme is suitable for a measurement of weak light since it has no accumulation region, and therefore the are of the photosensitive region is increased. In the full-frame transfer (FFT) scheme, however, since incident light is absorbed by charge transfer electrodes, the sensitivity considerably decreases for a short wavelength light with a large absorption coefficient.

The photosensitive region of a CCD that employs the typical full-frame transfer (FET) scheme has a structure in which the front surface of the photosensitive region is covered with transfer electrodes of polysilicon. Since polysilicon absorbs light with a wavelength of 400 nm or less, it cannot contribute to photoelectric conversion.

For some of such photodetectors, the photosensitive region of the substrate is thinned to about 10 μm to 30 μm to irradiate light from the back surface. When light is incident from the back surface, no obstacles are present on the back surface of the substrate except a thin oxide film. Hence, the sensitivity can be expected to become high for short-wavelength light. The back-illuminated CCD has a sensitivity to short-wavelength light of about 200 nm and can be applied even to an electron-bombard CCD device.

However, the saturation charge of a CCD is smaller than that of another image sensor. For this reason, if an object has a point with a high light intensity, generated signal charges spill over from a pixel to neighboring pixels. This results in a phenomenon that the image of the highlight portion looks like a several-time spread, i.e., blooming, and generated signals of the neighboring pixels are is lost.

Hence, to detect weak light immediately adjacent to strong light by a CCD for a spectroscope, an OFD (Over Flow Drain) for removing excess charges must be arranged to prevent any blooming of a signal of strong light.

An over flow drain applied to the frame transfer (FT) scheme or full-frame transfer (FFT) scheme is disclosed in, e.g., William Des Jardin and Stephen Kosman, "True two-phase CCD image sensors employing a transparent gate", SPIE Vol. 3649, January 1999. A front-illuminated CCD is disclosed here, in which an over flow drain and a barrier region to the over flow drain are continuously formed on one side of each pixel.

In a conventional back-illuminated CCD as well, an over flow drain and a barrier region to the over flow drain are continuously formed on one side of each pixel, like the front-illuminated CCD. However, for the back-illuminated CCD, since a substrate portion where a vertical over flow drain is to be formed must be thinned by etching, no so-called VOFD (Vertical Over Flow Drain) can be formed. Even for a fully depleted CCD, since a substrate portion where a vertical over flow drain is to be formed is designed as a region for collecting charges, no vertical over flow drain can be formed. Hence, the back-illuminated CCD and fully depleted COD have no portions where a vertical over flow drain is to be formed. The back-illuminated CCD and fully depleted CCD therefore employ a so-called LOFD (Lateral Over Flow Drain). A three-phase CCD having a lateral over flow drain will be described with reference to FIGS. 1 to 4.

FIG. 1 is a plan view showing a conventional three-phase CCD having a lateral over flow drain. FIGS. 2 to 4 are sectional views taken along lines in FIG. 1. A vertical transfer channel 402 and isolation region 403 are formed on a p-type silicon substrate 401. A silicon oxide layer 404 is formed on the resultant structure. A plurality of vertical transfer electrodes 405 are formed on the silicon oxide layer 404. In this case, since the device is a three-phase CCD, three vertical transfer electrodes 405 are arranged. An over flow drain 406 and a barrier region 407 to the over flow drain are continuously formed on one side of each pixel. The over flow drain 406 and barrier region 407 to the over flow drain remove excess charges, thereby preventing blooming and smearing.

As described above, in the conventional CCD, the over flow drain 406 and barrier region 407 to the over flow drain are formed for all transfer electrodes in each pixel. Hence, especially in a back-illuminated CCD, since the lateral over flow drain is employed, the area of the region used to accumulate/transfer charges decreases due to the region where the over flow drain is formed. This decreases the amount of saturation charges of the CCD and reduces the aperture ratio.

SUMMARY OF THE INVENTION

The present invention has been made in consideration of the above situation, and has as its object to provide a semiconductor energy detector capable of improving the saturation charge and aperture ratio.

In order to achieve the above object, according to the present invention, there is provided a semiconductor energy detector having a region for detection and charge accumulation/transfer where a two-dimensional pixel array is formed on a surface of a semiconductor substrate on which energy rays become incident, characterized in that the region for detection and charge accumulation/transfer comprises a plurality of transfer electrodes formed in each pixel, and excess charge removing means arranged in correspondence with one of the transfer electrodes in each pixel.

The present invention will become more fully understood from the detailed description given hereinbelow and the accompanying drawings which are given by way of illustration only, and thus are not to be considered as limiting the present invention.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

DESCRIPTION OF THE PREFERRED EMBODIMENTS

Figure 1:
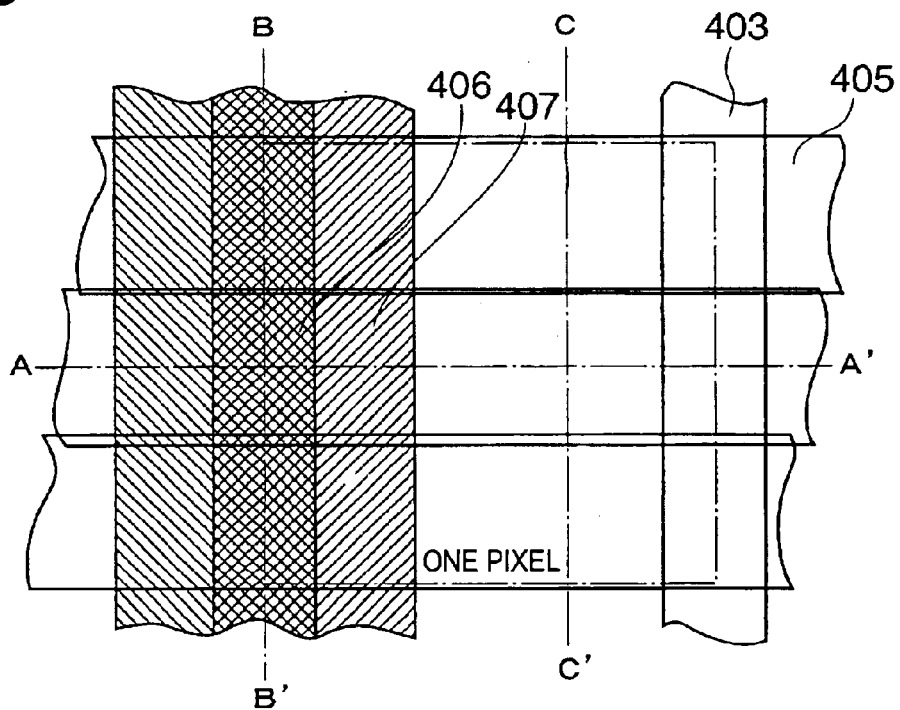
FIG. 1 is a plan view showing a conventional three-phase CCD having a lateral over flow drain.
Figure 2:
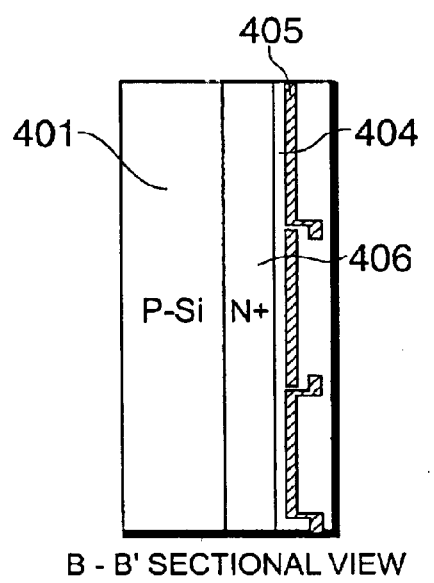
FIG. 2 is a cross-sectional view taken along a line B–B' in FIG. 1.
Figure 3:
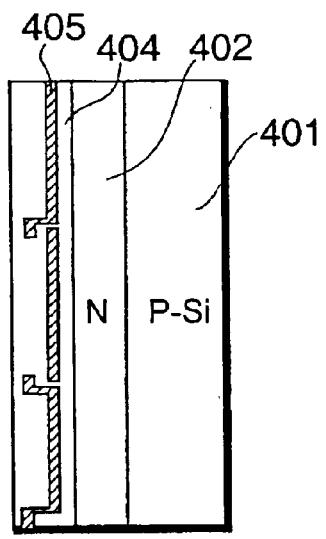
FIG. 3 is a cross-sectional view taken along a line C–C' in FIG. 1.
Figure 4:
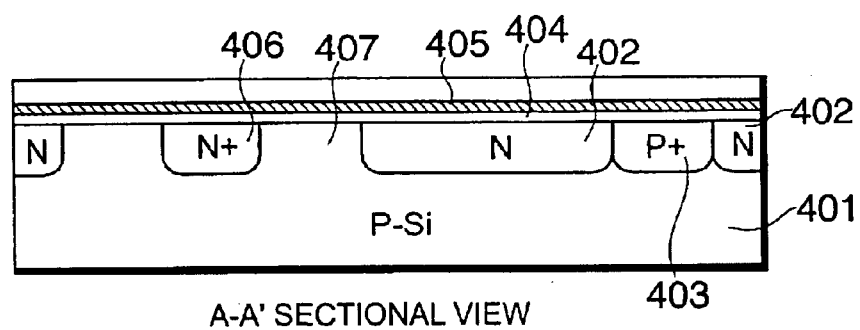
FIG. 4 is a cross-sectional view taken along a line A–A' in FIG. 1.

A semiconductor energy detector according to the present invention is a semiconductor energy detector having a region for detection and charge accumulation/transfer where a two-dimensional pixel array is formed on a surface of a semiconductor substrate on which energy rays become incident, wherein the region for detection and charge accumulation/transfer comprises a plurality of transfer electrodes formed in each pixel, and excess charge removing means arranged in correspondence with one of the transfer electrodes in each pixel.

An over flow drain and barrier region to the over flow drain (these will be referred to altogether as an "over flow drain and the like" hereinafter) need not be continuously formed on one side of each pixel. The same effect as in the prior art can be obtained by forming an over flow drain and the like for only one of a plurality of transfer electrodes in each pixel. Hence, instead of forming an over flow drain and the like for all transfer electrodes in each pixel, the over flow drain and the like serving as an excess charge removing means are formed for only one transfer electrode in each pixel. With this arrangement, the over flow drain can be obtained. At the same time, the accumulation/transfer region in the other transfer electrodes can be extended. Hence, the saturation charge and aperture ratio can be improved.

The present invention may employ an arrangement that makes energy rays incident from the back surface of a semiconductor substrate.

When light becomes incident from the back surface, no obstacles are present on the back surface of the substrate except a thin oxide film. Hence, the sensitivity can be expected to be high for short-wavelength light. In a back-illuminated CCD, since the substrate is thinned from the back surface, no vertical over flow drain can be formed. Instead, a lateral over flow drain is employed. Even in employing the lateral over flow drain, when the over flow drain and the like serving as an excess charge removing means are formed for only one transfer electrode in each pixel, the over flow drain can be obtained. In the other transfer electrodes, portions used for the over flow drain and the like can be extended to the transfer electrodes. Hence, the saturation charge and aperture ratio can be increased. As described above, the present invention is particularly effective for a back-illuminated CCD that can employ no vertical over flow drain.

A plurality of transfer electrodes formed in each pixel may have almost equal areas.

The saturation charge of one pixel is proportional to the area of the transfer electrode. When a plurality of transfer electrodes are formed in one pixel, the saturation charge depends on the is smallest transfer electrode. When the plurality of transfer electrodes formed in each pixel have almost equal areas, the area of the transfer electrode with the over flow drain and the like is avoided from becoming smaller than those of the remaining transfer electrodes. As a result, the saturation charge can be increased as compared to a case wherein the over flow drain and the like are continuously formed on one side of each pixel.

The transfer-direction length of the transfer electrode having the excess charge removing means may be larger than those of the other transfer electrodes in the same pixel.

When the transfer-direction length of the transfer electrode having the over flow drain and the like is larger than those of the other transfer electrodes in the same pixel, the area of the transfer electrode having the over flow drain and the like can easily be equal to those of the other transfer electrodes.

The semiconductor energy detector of the present invention may be a semiconductor energy detector having a region for detection and charge accumulation/transfer where a two-dimensional pixel array is formed on a surface of a semiconductor substrate on which energy rays become incident, wherein the region for detection and charge accumulation/transfer comprises a plurality of transfer electrodes formed in each pixel, an over flow drain formed for at least part of each pixel, and a discharge electrode connected to the over flow drain.

When the over flow drain is formed for at least one transfer electrode in each pixel, the over flow drain can be obtained. At the same time, the transfer region in the other transfer electrodes can be extended. Hence, the saturation charge and aperture ratio can be improved.

The best mode of carrying out the present invention will be described below in detail with reference to the accompanying drawings. The dimensional ratio in the drawings does not always match that in the description.

Figure 5:
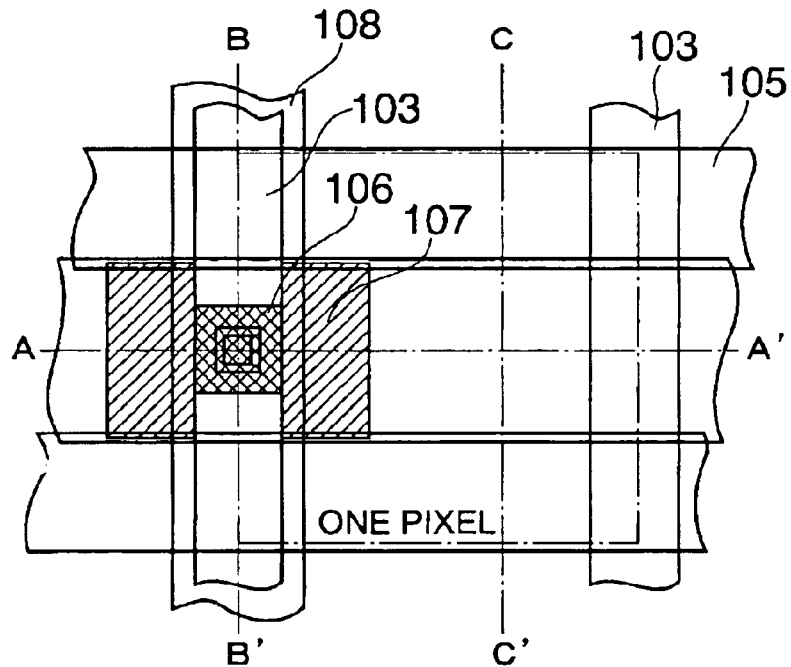
FIG. 5 is a plan view showing a pixel of a three-phase back-illuminated CCD having a lateral over flow drain according to an embodiment of the present invention.
Figure 6:
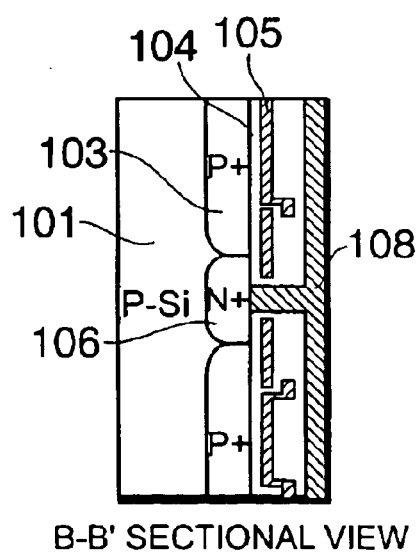
FIG. 6 is a cross-sectional view taken along a line B–B' in FIG. 5.
Figure 7:
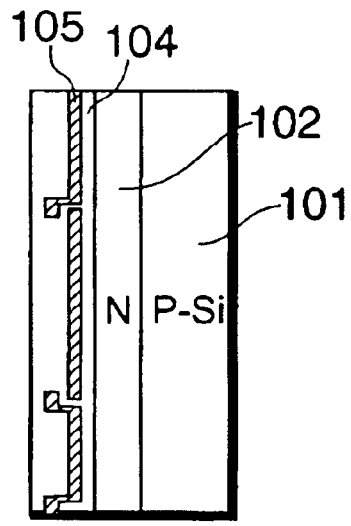
FIG. 7 is a cross-sectional view taken along a line C–C' in FIG. 5.
Figure 8:
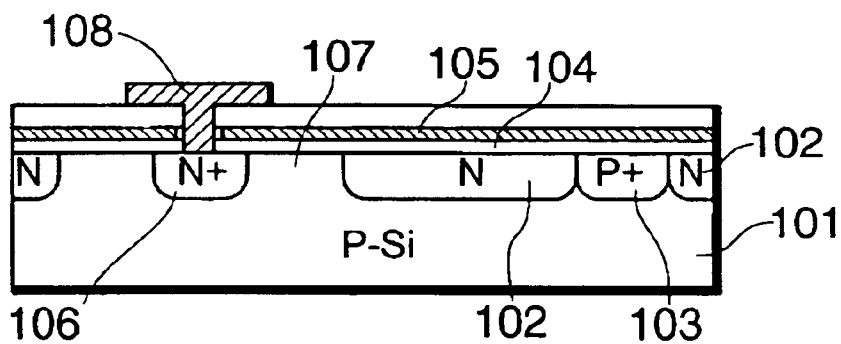
FIG. 8 is a cross-sectional view taken along a line A–A' in FIG. 5.

FIG. 5 is a plan view showing a pixel of a three-phase CCD having a lateral over flow drain according to an embodiment of the present invention. FIGS. 6 to 8 are sectional views taken along lines in FIG. 5. A vertical transfer channel 102 and isolation region 103 are formed on a p-type silicon substrate 101. A silicon oxide layer 104 is formed on the resultant structure. A plurality of vertical transfer electrodes 105 are formed on the silicon oxide layer 104. In this case, since the device is a three-phase CCD, three vertical transfer electrodes 105 are arranged.

An over flow drain 106 and a barrier region 107 to the over flow drain, which serve as an excess charge removing means, are formed for one vertical transfer electrode (the vertical transfer electrode at the center of the pixel shown in FIG. 5) in the three vertical transfer electrodes 105 to remove excess charges, thereby preventing blooming and smearing.

The over flow drain 106 and the barrier region 107 to the over flow drain (these will be referred to altogether as an "over flow drain and the like" hereinafter) need not be continuously formed on one side of each pixel. The same effect as in the prior art can be obtained by forming an over flow drain and the like for only one of a plurality of transfer electrodes in each pixel. Hence, instead of forming an over flow drain and the like for all transfer electrodes in each pixel, the over flow drain and the like serving as an excess charge removing means are formed for only one transfer electrode in each pixel, as in this embodiment. With this arrangement, the over flow drain can be obtained. At the same time, the accumulation/transfer region in the other transfer electrodes can be extended. Hence, the saturation charge and aperture ratio can be increased.

In this embodiment, the plurality of vertical transfer electrodes 105 formed in each pixel have almost equal areas. That is, the area of the vertical transfer electrode 105 having the over flow drain 106 and the like is almost equal to those of the other vertical transfer electrodes 105. The saturation charge of one pixel is proportional to the area of the transfer electrode. When a plurality of transfer electrodes are formed in one pixel, the saturation charge depends on the smallest transfer electrode. As in this embodiment, when the plurality of transfer electrodes formed in each pixel have almost equal areas, the area of the transfer electrode with the over flow drain and the like is avoided from becoming smaller than those of the other transfer electrodes. Hence, any limitation on the saturation charge can be prevented. As a result, the saturation charge can be increased as compared to a case wherein the over flow drain and the like are continuously formed on one side of each pixel.

Furthermore, in this embodiment, to make the plurality of transfer electrodes formed in each pixel have almost equal areas, the transfer-direction length of the transfer electrode 105 having the over flow drain 106 serving as an excess charge removing means is larger than those of the other transfer electrodes in the same pixel.

When the transfer-direction length of the transfer electrode having the over flow drain and the like is larger than those of the other transfer electrodes in the same pixel, the area of the transfer electrode having the over flow drain and the like can easily be equal to those of the other transfer electrodes.

An over flow drain wiring 108 is for the discharge path of the over flow drain 106. The over flow drain and the like are formed for only one transfer electrode in each pixel, as in this embodiment. In a back-illuminated CCD, even when the over flow drain and the like are led on the pixels by aluminum wirings through contact holes, the wiring surface is on the opposite side to the incident surface, Hence, the aperture ratio does not decrease. In a front-illuminated CCD, when a transparent electrode (ITO) is used as the wiring material of the over flow drain wiring 108, the aperture ratio does not decrease. As described above, according to this embodiment, in the back- and front-illuminated CCDs, the aperture ratio can be made higher than in a case wherein the over flow drain and the like are continuously formed on one side of each pixel.

Figure 9:
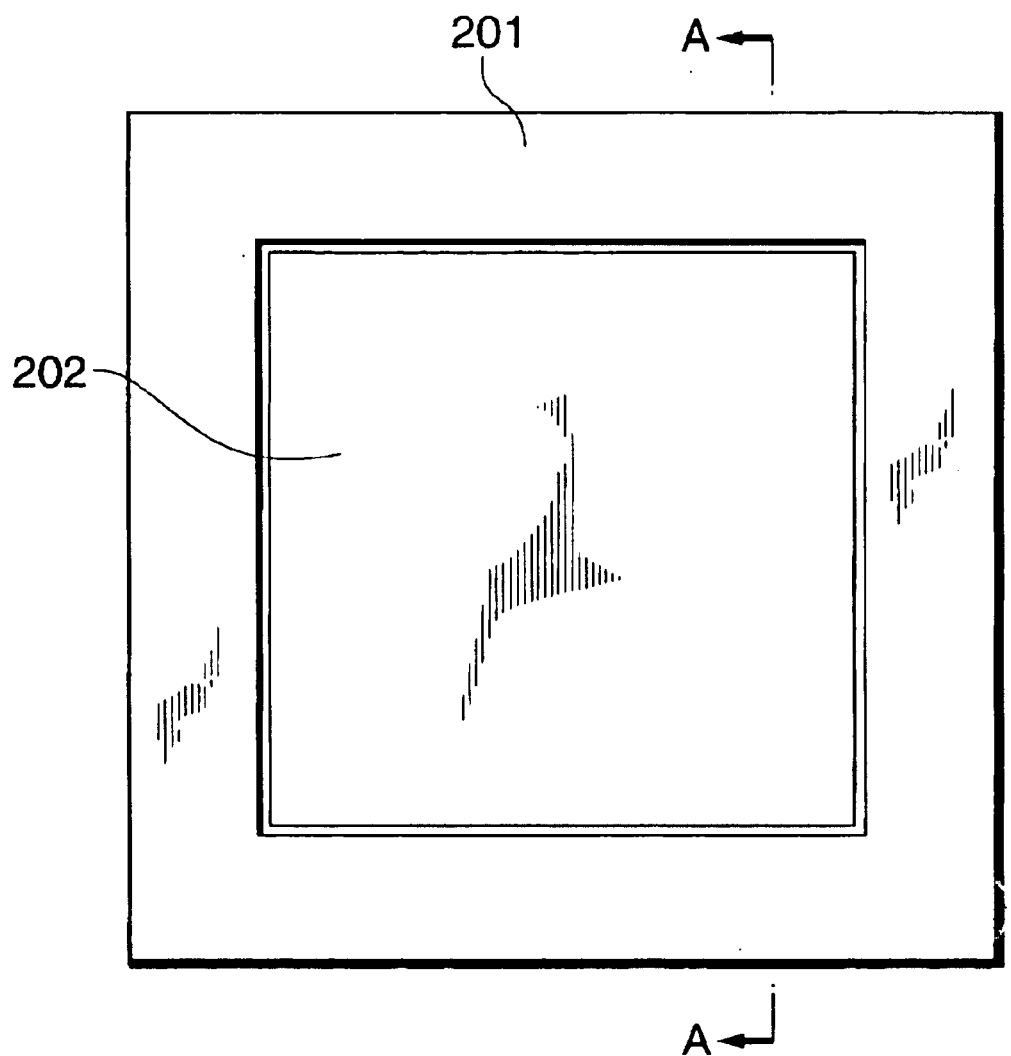
FIG. 9 is a plan view of a three-phase back-illuminated CCD having a lateral over flow drain according to the above embodiment.
Figure 10:
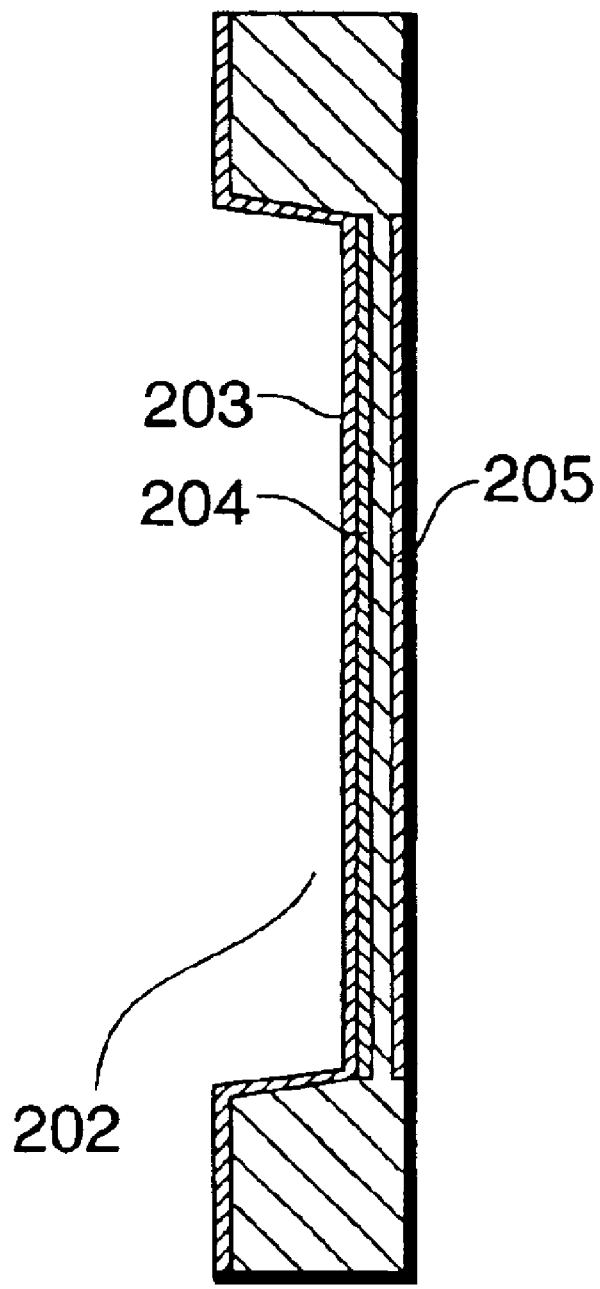
FIG. 10 is a cross-sectional view taken along a line A–A' in FIG. 9.

FIG. 9 is a plan view of a three-phase back-illuminated CCD having a lateral over flow drain according to an embodiment of the present invention when viewed from the illuminated surface side. FIG. 10 is a sectional view taken along a line A–A' in FIG. 9. A hollow 202 having a depth of about 270 to 290 $\mu$m is formed in a p-type silicon substrate 201 having a thickness of about 300 $\mu$m, a resistivity of about 10 to 100 $\Omega$·cm, and a plane orientation (100). The plane orientation (100) substrate is used because the charactors of CCD to suppress a dark current, improve the transfer efficiency, and reduce noise can be obtained. Especially, in a back-illuminated CCD, the substrate must be etched from the back surface side to thin the substrate. Silicon etching depends on the plane orientation. For this reason, the plane orientation (100) substrate is used in this embodiment. More specifically, a silicon nitride layer is formed on the p-type silicon substrate 201 and patterned into a desired shape by photolithography. The p-type silicon substrate 201 is etched by an etchant made of KOH using the resultant pattern as a mask while leaving the chip peripheral portion covered with the silicon nitride, thereby forming the hollow 202.

As shown in FIG. 10, a silicon oxide layer 203 having a thickness of about 0.1 $\mu$m film is formed on incident surface. A P' heavily doped layer 204 having a thickness of about 0.2 $\mu$m and an impurity concentration of about $5\times10^{18}$ cm$^{-3}$ is formed next to the silicon oxide layer to diffuse charges photoelectrically converted near the incident surface to the opposite surface side. A surface 205 on which CCD should be formed is formed on the surface opposite to the incident surface. Light that becomes incident from the light-receiving surface is photoelectrically converted in the region from the P$^+$ heavily doped layer 204 to the surface 205. Generated charges are diffused toward the surface 205, reach the potential well of the surface 205, and are accumulated.

When light becomes incident from the back surface, no obstacles are present on the back surface of the substrate except a thin oxide film. Hence, the sensitivity can be expected to be high for short-wavelength light. In a back-illuminated CCD, since the substrate is thinned from the back surface, no vertical over flow drain can be formed. Instead, a lateral over flow drain is employed. Even in employing the lateral over flow drain, when the over flow drain and the like serving as an excess charge removing means are formed for only one transfer electrode in each pixel, the over flow drain can be obtained. Hence, the saturation charge and aperture ratio can be increased. As described above, this embodiment is particularly effective for a back-illuminated CCD that can employ no vertical over flow drain.

Figure 11:
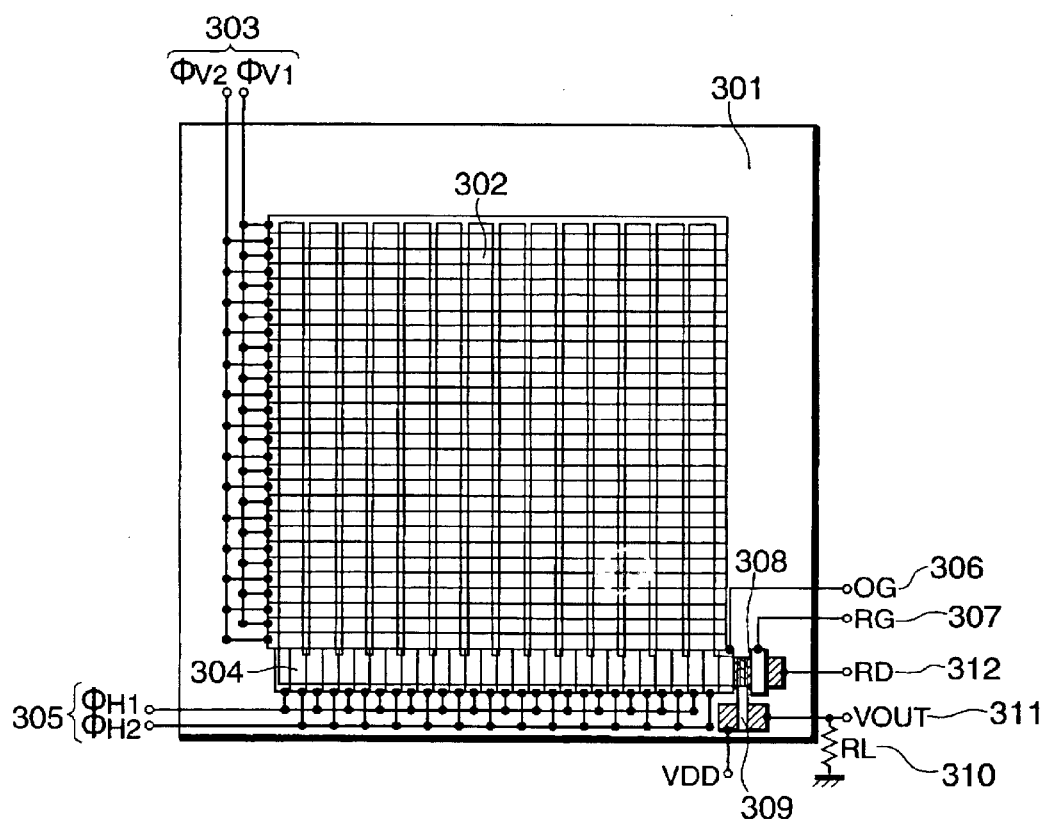
FIG. 11 is a view showing an opposite surface of the three-phase back-illuminated CCD having a lateral over flow drain according to the above embodiment.

FIG. 11 is a view showing an opposite surface of the incident surface of a three-phase back-illuminated CCD having a lateral over flow drain according to an embodiment of the present invention. A so-called full-frame transfer CCD is formed. On a p-type silicon substrate 301, 512 to 1024 columns of vertical transfer channels 302 each having a width of about 20 μm are arrayed. A vertical transfer electrode group 303 is laid out perpendicularly to the vertical transfer channels 302 to form a vertical shift register. The arrayed vertical transfer channels 302 are connected to one horizontal transfer channel 304 having a width of about 25 to 100 μm. A horizontal transfer electrode group 305 is laid out perpendicularly to the horizontal transfer channel 304 to form a horizontal shift register.

Charges accumulated in the potential well of the vertical shift register during the charge accumulation period are sequentially transferred from the vertical shift register to the horizontal shift register. The charges are transferred through the horizontal shift register and become a time-series signal. The charges transferred through the horizontal shift register pass under an output gate 306 at a predetermined potential and are sent into the potential well of a floating diffusion 308 kept at a predetermined potential by a reset gate 307 so as to change the potential of the floating diffusion 308. The change in potential is read through a source follower circuit formed from an on-chip FET 309 and external load resistor 310, thereby obtaining an output from an output terminal 311. After that, the charges sent into the potential well of the floating diffusion 308 pass under the reset gate 307 and are removed from a reset drain 312.

As is apparent from the above description, according to the present invention, an over flow drain and the like serving as an excess charge removing means are formed for only one transfer electrode in each pixel. With this arrangement, the over flow drain can be obtained. Simultaneously, the transfer region, i.e., the opening region in the other transfer electrodes can be extended. Hence, the saturation charge and aperture ratio can be improved.

PCT/JP00/09140 and Japanese Patent Application No. Hei 11-367631 are hereby incorporated by reference in its/their entirety.

From the invention thus described, it will be obvious that the embodiments of the invention may be varied in many ways. Such variations are not to be regarded as a departure from the spirit and scope of the invention, and all such modifications as would be obvious to one skilled in the art are intended for inclusion within the scope of the following claims.

What is claimed is:

1. A semiconductor energy detector having a region for detection and charge accumulation/transfer where a two-dimensional pixel array is formed on a surface of a semiconductor substrate on which energy rays become incident, the region for detection and charge accumulation/transfer comprising:
a plurality of transfer electrodes formed in each pixel, and
excess charge removing means arranged in correspondence with only one of said transfer electrodes in each pixel.

2. A semiconductor energy detector according to claim 1, wherein energy rays are incident from a back surface of the semiconductor substrate.

3. A semiconductor energy detector according to claim 1, wherein said plurality of transfer electrodes formed in each pixel have almost equal areas.

4. A semiconductor energy detector according to any one of claims 1, wherein a transfer-direction length of said transfer electrode having said excess charge removing means is larger than those of said remaining transfer electrodes in the same pixel.

5. A semiconductor energy detector according to claim 1, wherein said excess charge removing means improves the saturation charge and aperture ratio of the detector.

6. A semiconductor energy detector having a region for detection and charge accumulation/transfer where a two-dimensional pixel array is formed on a surface of a semiconductor substrate on which energy rays become incident, the region for detection and charge accumulation/transfer comprising:
a plurality of transfer electrodes formed in each pixel,
an over flow drain formed for only one transfer electrode in each pixel, and
a discharge electrode connected to said over flow drain.

7. A semiconductor energy detector according to claim 6, wherein said over flow drain improves the saturation charge and aperture ratio of the detector.

* * * * *